US007518069B2

(12) United States Patent
Alo et al.

(10) Patent No.: US 7,518,069 B2
(45) Date of Patent: Apr. 14, 2009

(54) APPARATUS AND METHOD FOR PROVIDING A CONTROL PANEL THAT REDUCES OVERALL SIZE WHILE PROVIDING INTEGRATED BUTTON PROTECTION FOR FUNCTIONAL ADVANTAGE

(75) Inventors: Roland Kamakau Alo, Raleigh, NC (US); David Frederick Champion, Durham, NC (US); Timothy Andreas Meserth, Durham, NC (US); Michael Sven Miller, Raleigh, NC (US); Gerard Francis Muenkel, Raleigh, NC (US); David Thomas Windell, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/683,668

(22) Filed: Mar. 8, 2007

(65) Prior Publication Data

US 2009/0050461 A1 Feb. 26, 2009

(51) Int. Cl.
*H01H 13/70* (2006.01)
(52) U.S. Cl. ....................................................... 200/5 R
(58) Field of Classification Search .............. 200/50.36, 200/43.16, 333, 334, 43.01, 43.18, 43.19
See application file for complete search history.

(56) References Cited

U.S. PATENT DOCUMENTS

| 2,594,181 | A | * | 4/1952 | Kliegl et al. .................... 200/4 |
| 5,794,759 | A | * | 8/1998 | Butts ........................ 200/43.19 |
| 5,925,860 | A | * | 7/1999 | Lee .............................. 200/18 |
| 6,340,800 | B1 | | 1/2002 | Zhai et al. |
| 6,743,987 | B1 | * | 6/2004 | Remmert et al. ......... 200/50.33 |
| 2005/0061640 | A1 | | 3/2005 | Lecroix |
| 2006/0038793 | A1 | | 2/2006 | Philipp |

* cited by examiner

*Primary Examiner*—Edwin A. Leon
(74) *Attorney, Agent, or Firm*—William Konrad; Konrad Raynes & Victor LLP

(57) ABSTRACT

An apparatus and method for providing a control panel that reduces overall size while providing integrated button protection for functional advantage. The control panel includes a function activator disposed at a fixed position on panel face of a device and a moveable cover, disposed over the panel face, the moveable cover having a first selection aperture configured to allow selection of a desired function by allowing engagement of a function activator only when the first selection aperture is moved to align with a function activator associated with the desired function.

4 Claims, 16 Drawing Sheets

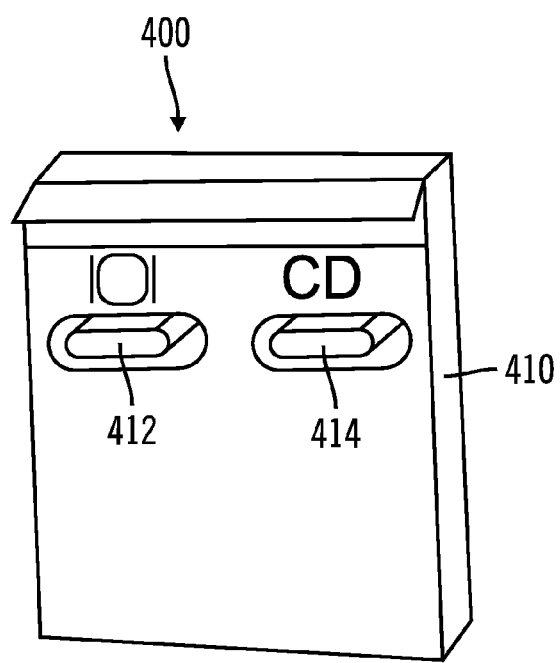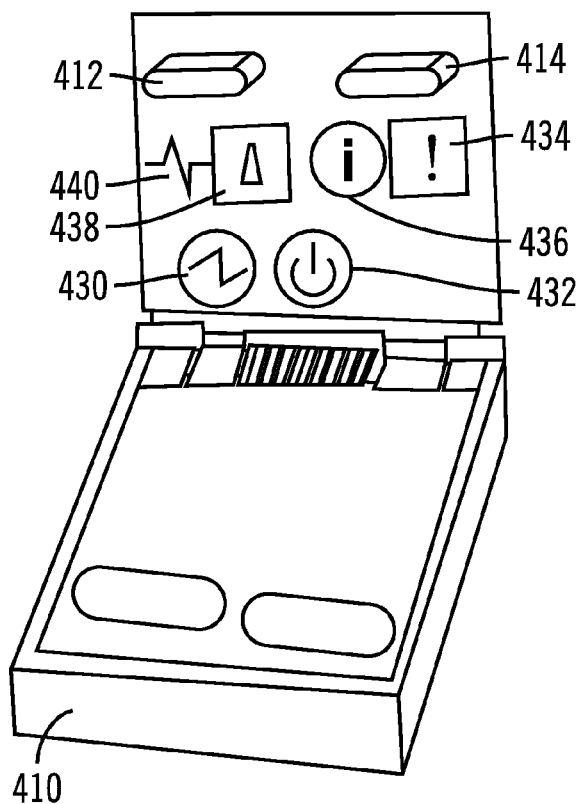
FIG. 4A
PRIOR ART
FIG. 4B
PRIOR ART

APPARATUS AND METHOD FOR PROVIDING A CONTROL PANEL THAT REDUCES OVERALL SIZE WHILE PROVIDING INTEGRATED BUTTON PROTECTION FOR FUNCTIONAL ADVANTAGE

BACKGROUND OF THE INVENTION

1. Field of the Invention

This invention relates in general to control panels for rack mounted equipment, and more particularly to an apparatus and method for providing a control panel that reduces overall size while providing integrated button protection for functional advantage.

2. Description of Related Art

Electrical equipment racks are commonly used to stack a plurality of system chassis. Rack mount enclosures are compact in design and allow for mounting of various components (e.g., servers, switches, power distribution units, etc.) in a stacked style configuration. Utilizing racks allows a user to include various rack-mounted components in the rack, decreasing the footprint, while the components remain easily accessible for maintenance.

Rack space is always at a premium, and various designs have been created to increase the density of equipment storage. For example, some chassis may be mounted upon telescoping rail assemblies to facilitate forward and rearward motion of the chassis in respect to the rack for purposes of performing maintenance and renewal operations on system components that are attached to the chassis.

However, heat is increased by mounting multiple components in a rack, thereby causing deterioration and possible failure of many of the components. Mass data storage systems, tape backup systems, automated tape library systems, electronic test equipment, telecommunications equipment, network servers, routers and firewalls are often mounted in cabinets and rack mount frames. For example, most server systems generate a large amount of heat that requires cooling in order to maintain proper function. The generated heat must be displaced to ensure proper function of all components. Fans are the most common method used to remove this heat.

A frequently underestimated conflict in the design of a high-performance computer is the trade-off between design for density and the ability of the fans to move hot air away from the system. Thus, airflow for cooling products is an increasing requirement. Nevertheless, control panels often block valuable real estate that could be used for more air vents.

For example, current control panels on some blade servers include three primary buttons, a smaller non-maskable interrupt (NMI) button, 5-6 LEDs, and a hinging door protecting the power button. FIG. 3 illustrates a current control panel 300 for a blade server that is located at the top of the blade server. The control panel 300 includes system information LEDs and control switches 312, 314. A media-select button 312 is provided to allow a CDROM drive, diskette drive, and USB port to be associated with the blade server. The media select button 312 lights when the ownership of the CD-ROM drive, diskette drive, and USB port transfers to this blade server. Blade-error LED 320 is used to indicate that a system error has occurred in the blade. Information LED 322 is used to indicate information about a system error for the server has been placed in the error log. Location LED 324 is turned on in response to a programmed condition or remotely by the system administrator to aid in blade identification for maintenance. The location LED 324 will be on also. After maintenance has been completed the location LED 324 is turned off. Activity LED 326 indicates that there is activity in the blade server. This includes hard disk and network activity. Power-on LED 328 indicates that the server has AC power. The console select button 314 is used to associate the keyboard mouse and video ports with this blade server. This button 314 lights when the ownership of the keyboard mouse and video transfers to this blade server. A power-control button is located behind the control panel door. The power control button is pressed to manually turn the blade server on or off.

FIGS. 4*a-b* illustrates a second embodiment of a current control panel 400. In FIG. 4*a*, a hinged cover 410 is shown in the closed position. However, the video 412 and CD 414 buttons are accessible with the hinged cover 410 in the closed position. FIG. 4*b* shows the hinged cover 410 in the open position. When the hinged cover 410 in the open position the LEDs 430-440 for diagnostics are visible and the power button 432 is accessible. To provide greater airflow, it would be beneficial if current control panels could be replaced with control panels designed to take up even less surface area. However, simply reducing the size of the control panel may result in additional disadvantages. For example, to allow for readability, the size of icons should not be reduced to a point that renders the icons meaningless. Likewise, the spacing between buttons should not be reduced to such an extent that human-machine interaction is negatively effected. The spacing requirement is intended to prevent accidental activation of one button when depressing an adjacent one.

It can be seen that there is a need for an apparatus and method for providing a control panel that reduces overall size while providing integrated button protection for functional advantage.

SUMMARY OF THE INVENTION

To overcome the limitations in the prior art described above, and to overcome other limitations that will become apparent upon reading and understanding the present specification, the present invention discloses an apparatus and method for providing a control panel that reduces overall size while providing integrated button protection for functional advantage.

The present invention solves the above-described problems by providing a control panel that is small to allow increased airflow around the control panel. The control panel includes a lens cover that provided increased protection against accidental function activation. The functions may be activated using only a single finger or by using a mouth stick, which complies with CI 162 disability access.

A control panel in accordance with the principles of the present invention includes a function activator disposed at a fixed position on panel face of a device and a moveable cover, disposed over the panel face, the moveable cover having a first selection aperture configured to allow selection of a desired function by allowing engagement of a function activator only when the first selection aperture is moved to align with a function activator associated with the desired function.

In another embodiment of the present invention, a method for providing a control panel that reduces overall size while providing integrated button protection for functional advantage is provided. The method includes rotating a cover to move a selection aperture from a normal position to a position over an icon on a panel face for selecting a desired function of a device, allowing engagement of a function activator represented by the icon only when the selection aperture is moved to align with the icon and activating the desired function while the selection aperture is over the icon for selecting the function.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 illustrates

FIGS. 4a-b illustrates a second embodiment of a current control panel;

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides an apparatus and method for providing a control panel that reduces overall size while providing integrated button protection for functional advantage. The control panel that is small to allow increased airflow around the control panel. The control panel also includes a lens cover that provided increased protection against accidental function activation. The functions may be activated using only a single finger or by using a mouth stick, which complies with CI 162 disability access.

Figure 1:
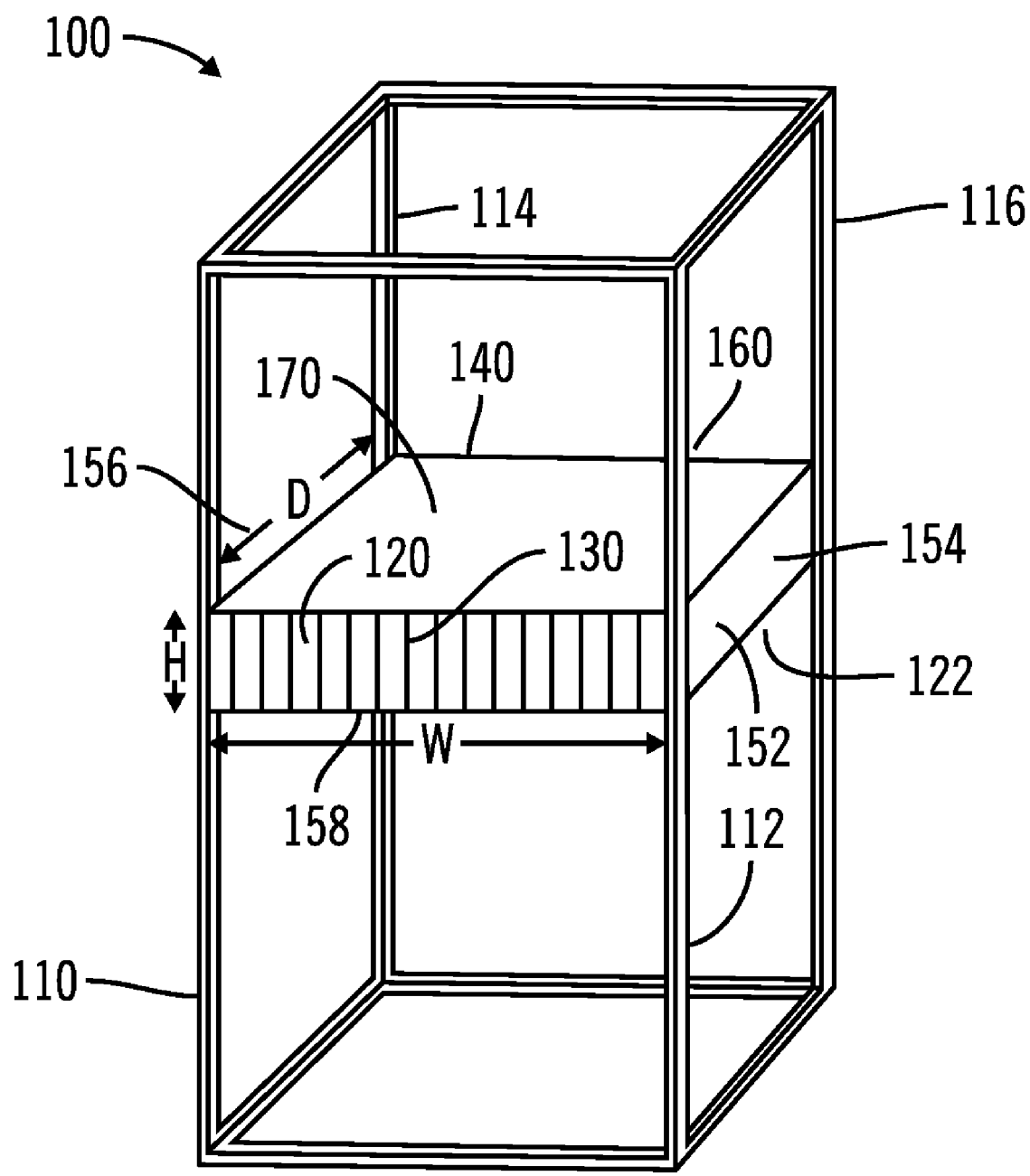
FIG. 1 illustrates a schematic perspective representation of a rack system.

FIG. 1 illustrates a schematic perspective representation of a rack system 100. In FIG. 1, rack system 100 includes left and right front uprights 110, 112 and left and right rear uprights 114, 116. The uprights can be formed with apertures for receiving shelf fixings (e.g., screws, bolts, clips, etc., for mounting brackets, slides, rails, etc.). Electronic devices 120, such as test equipment, sound system equipment, blade servers, etc., may be mounted in the rack system 100. For mounting such devices, a shelf 122 may be used to provide a carrier configured to carry a plurality of devices 120 located side by side along the shelf. The term "shelf" is used herein in a conventional way to describe a structure that is mountable in rack system 100 and is configured to carry one or more components to form at least a part of a rack-mountable system. In the present example, the shelf 122 is three-dimensional, having a height (H), width (W) and depth (D).

The devices 120, when aligned in the carrier shelf 122, look like rectangular blocks, or blades. Accordingly, the devices 120 can be described as a blade. In FIG. 1, the shelf 122 is configured to carry sixteen devices 120, each of which is removably mountable in a respective opening 130 in the front of the shelf, whereby the devices 120 can be inserted into and removed from the front of the shelf 122 without removing the shelf 122 from the rack system 100.

The shelf 122 includes a three-dimensional, generally rectangular, enclosure, or housing, 140 that is suitable for mounting in generic racking systems. It can be mounted on fixed rigid rack mounting ears and/or a simple slide/support system. The shelf enclosure 140 can be configured to form a chassis that includes a base 152, two sides 154, 156, a front 158 and a rear 160. The word "front" as used here is merely used as a label herein to refer to the face, or wall 158 of the enclosure that is located at the main access side of the rack system 100 in use when the shelf is mounted therein. Similarly, the words "rear" and "side" are merely used as labels herein to refer to the faces, or walls 154, 156, 160, that, in use, are located at those respective positions when the shelf is mounted in the rack system 100.

The openings 130 can be formed in the front face 158 for receiving the devices 120. The enclosure can further include a removable top cover 170 that can be secured by suitable fastening.

Figure 2:
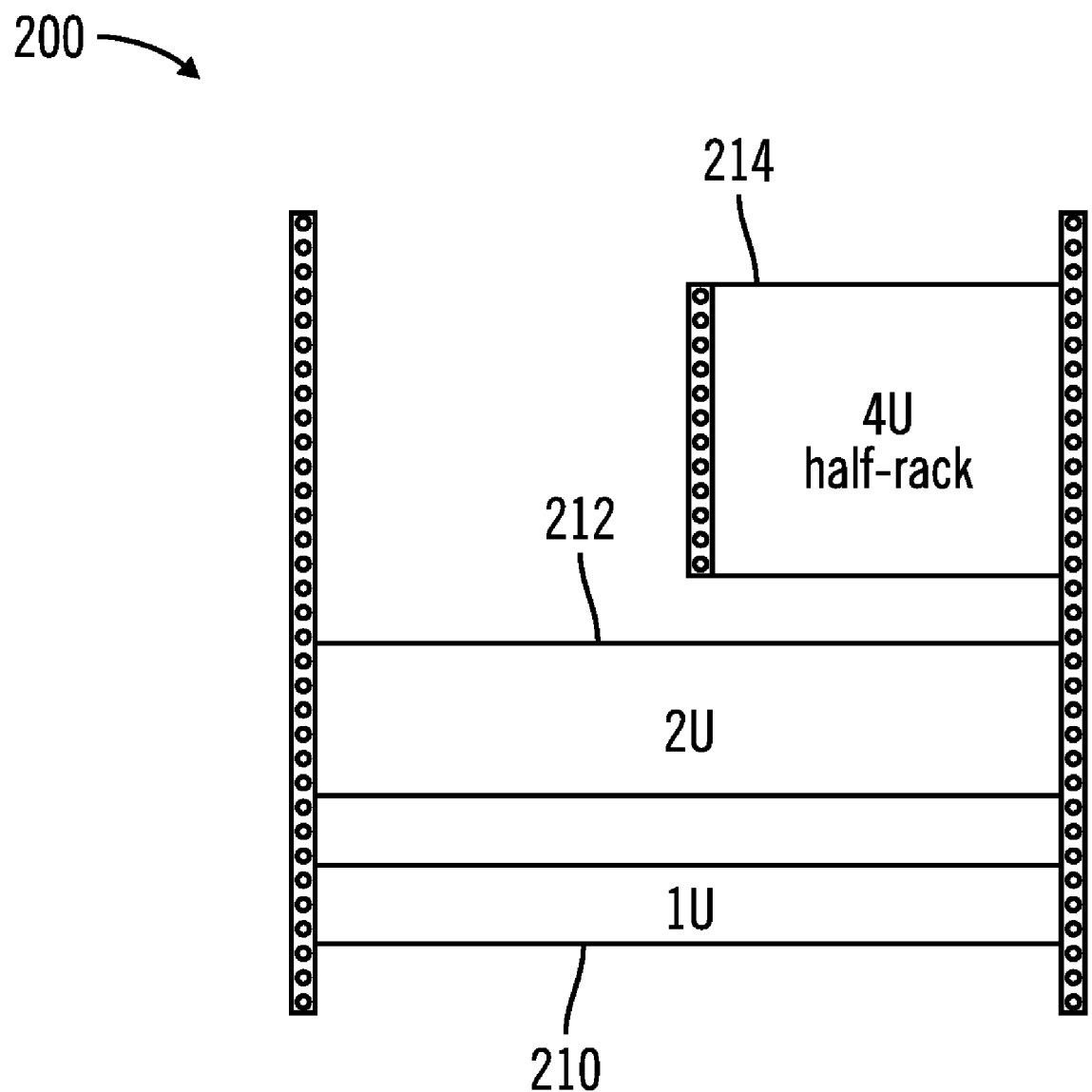
FIG. 2 is a front view of a rack system.
Figures 3A, 3B:
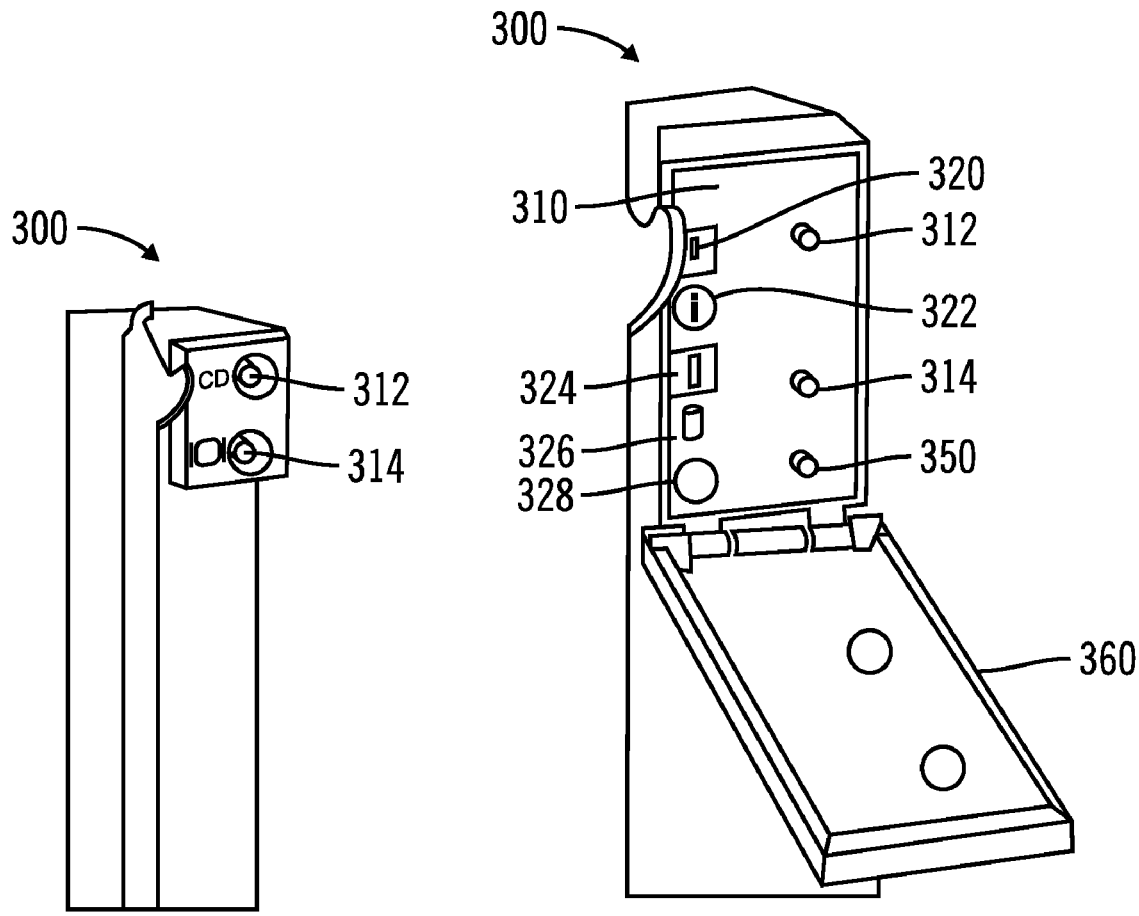
FIGS. 3a and 3b illustrate a current control panel for a blade server that is located at the top of the blade server.

FIG. 2 is a front view of a rack system 200. In FIG. 2, three shelf units 210, 212, 214 are shown mounted in rack system 200. The size of the shelf units 210, 212, 214 are referred to in rack units, which is a unit of measure used to describe the height of the shelf units 210, 212, 214. One rack unit is commonly designated as "1U"; similarly, 2 rack units are "2U" and so on. The size of a piece of rack-mounted equipment is usually described as a number in "U".

Half-rack units typically describe units that fit in a certain number of rack units, but occupy only half the width of the rack (9.5 inches). For example, a "4U half-rack" device would occupy 4U space (4×1.75 inches) height×9.5 inches width. In theory, two half-rack devices could occupy the 4U space.

Rack mountable devices are often designed to provide airflow over, around or through the devices. However, with some devices, such as blade servers, a control panel is often provided at the front, which can impede the airflow thereby resulting in an increase in the internal temperature of the devices.

As mentioned earlier, it would be beneficial if the size of a control panel could be minimized to provide greater airflow. However, simply reducing the size of the control panel may result in additional disadvantages. For example, to allow for readability, the size of icons should not be reduced to a point that renders the icons meaningless. Likewise, the spacing between buttons should not be reduced to such an extent that human-machine interaction is negatively effected. The spacing requirement is intended to prevent accidental activation of one button when depressing an adjacent one.

Figure 5:
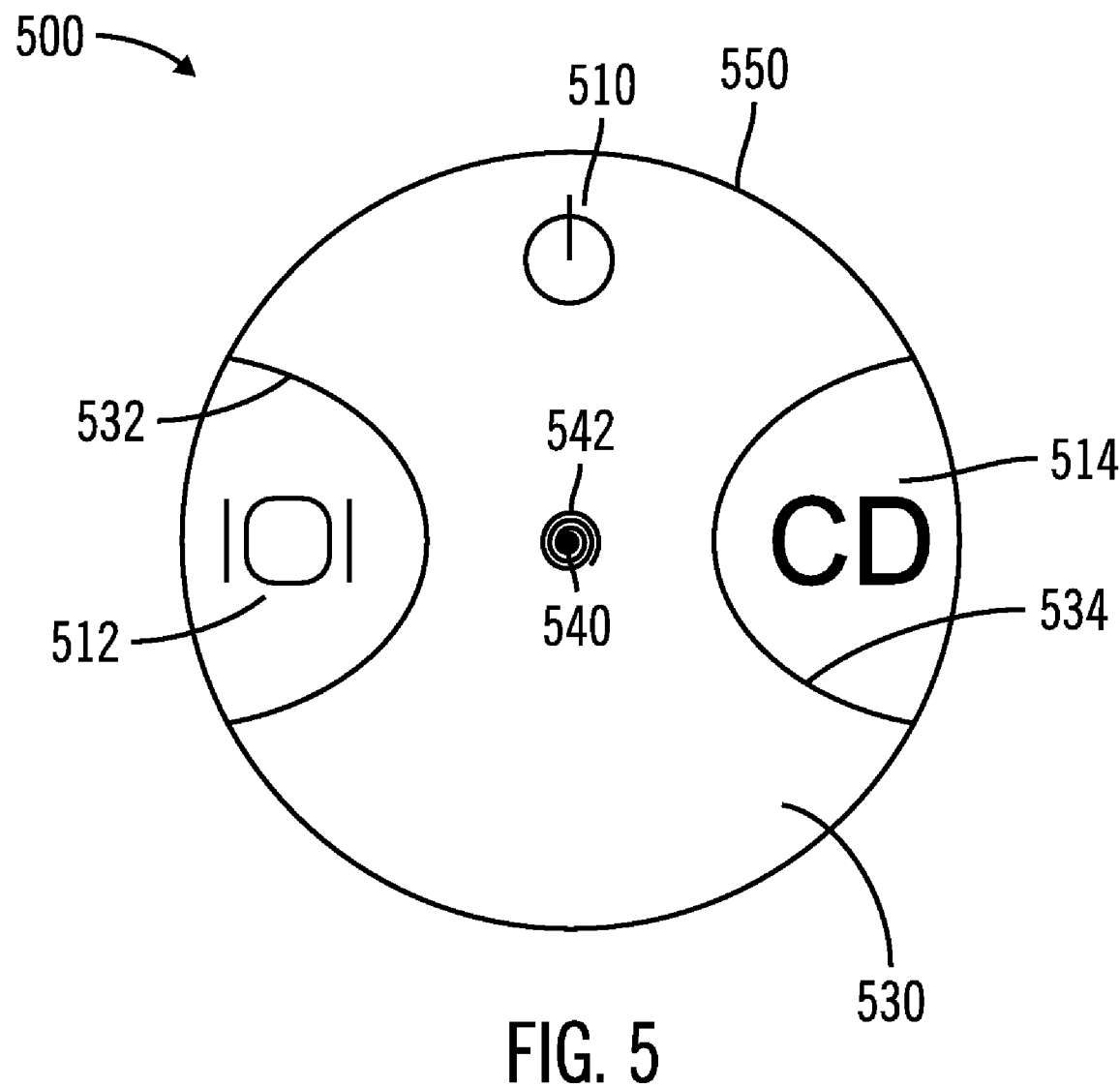
FIG. 5 shows a control panel that reduces overall size while providing integrated button protection for functional advantage according to an embodiment of the present invention.

FIG. 5 shows a control panel 500 that reduces overall size while providing integrated button protection for functional advantage according to an embodiment of the present invention. The control panel 500 includes elements 510, 512, 514, which may include function activators, such as switches, and LEDs that provide information to the user. Those skilled in the art will recognize that the term switches may include a two-position button, a digital push selector, a toggle switch or any other device for changing a state of a function activator. The function activators and LEDs are fixed at a position on the device. A function activator may incorporate LEDs. Further, those skilled in the art, however, will recognize that the present invention is not meant to be limited to the quantity of buttons and LEDs shown here. The control panel 500 may be configured with various quantities of LEDs and buttons.

In FIG. 5, the control panel 500 includes three buttons: video 512, CD 514, and power 510. The panel 500 also includes a lens 530 with a selection aperture. A selection aperture may be a cutout, a window or other physical feature that is used to align a function activator, such as a button or switch, with a predetermined position of the lens 530. The lens 530 is moveable relative to the control panel LEDs and/or buttons. In FIG. 5, the lens includes cutouts 532, 534 as selection apertures.

In FIG. 5, the cutouts 532, 534 are positioned on the left and right over the video 512 and CD 514 buttons. The cutouts 532, 534 allow the user immediate access to the video 512 and CD 514 buttons when the lens is positioned in a normal position as shown. However, the lens 530 is configured to protect the power button 510 from accidental activation because the power button is a critical function. Thus, the power button 510 is protected from accidental activation by the lens because the lens 530 covers the power button 510 when the lens 530 is in the normal position. In FIG. 5, the lens 530 is configured to rotate on a center pivot 540. The lens 530 may also have a spring return 542. When the lens 530 is rotated 90 degrees; the power button 510 becomes accessible. Also, when the lens 530 is rotated to access the power button 510, the other two buttons 512, 514 are immediately protected.

Figure 6:
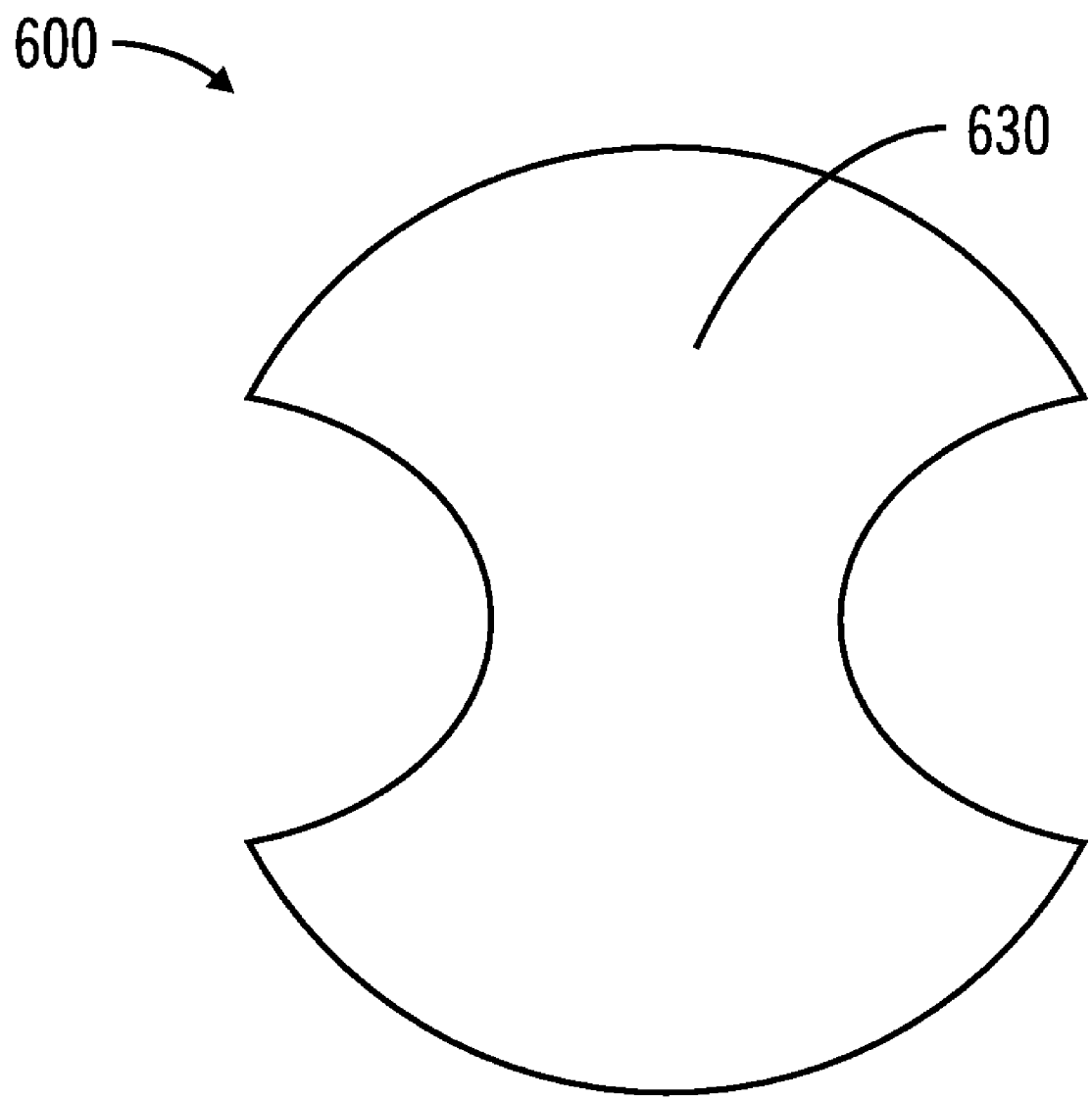
FIG. 6 is a detailed illustration of the translucent lens/cover in normal position.
Figure 7:
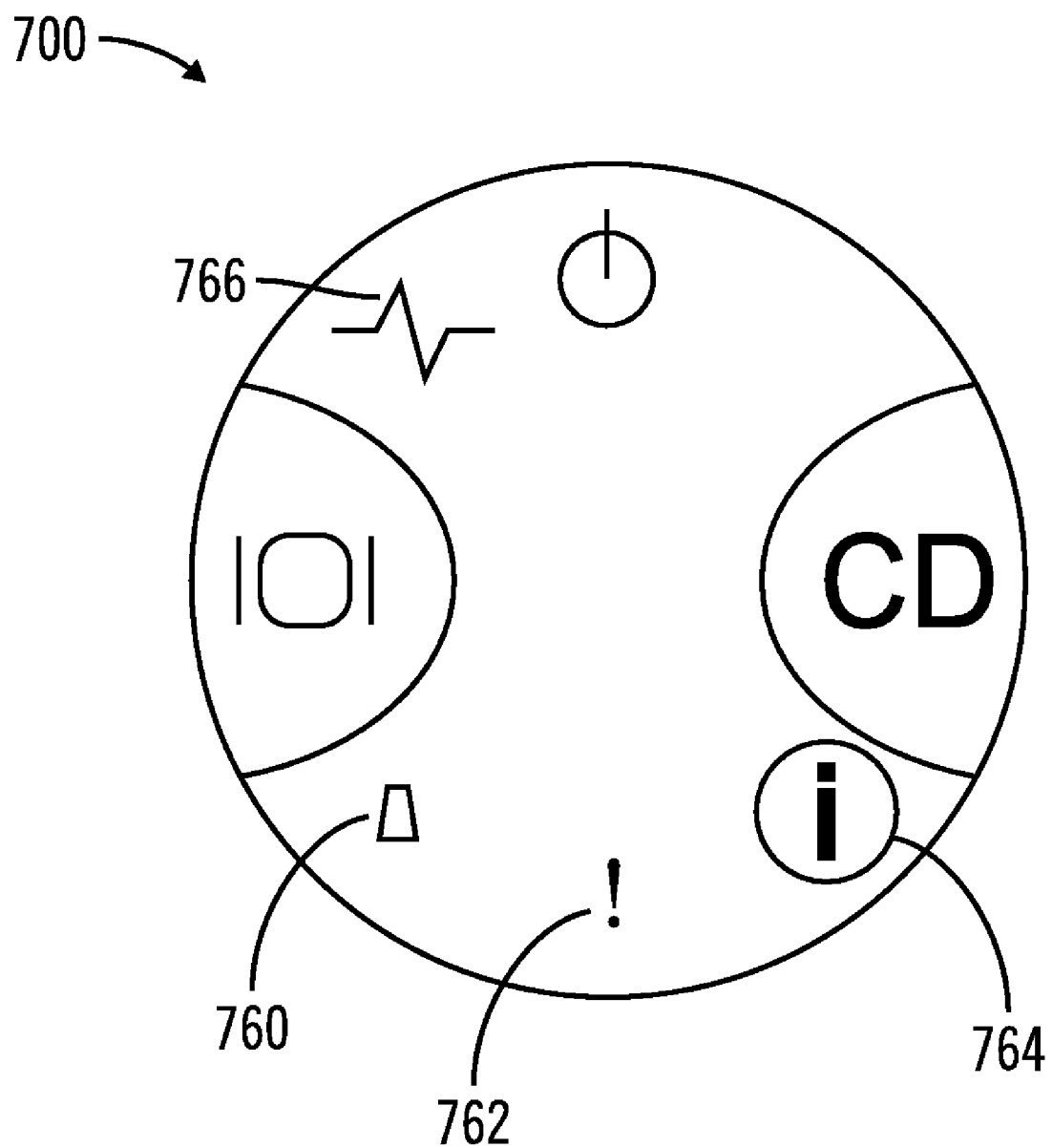
FIG. 7 is a reference view showing all LEDs lit.

Even though all buttons 510, 512, 514 are close together, the control panel 500 prevents the inadvertent pressing of two buttons at once. The lens 530 is rotated either by grasping the outer circumference 550 or by placing one finger (or a mouth stick) in a lens cutout 532, 534 and rotating the lens 530, e.g., similar to a rotary dial phone. FIG. 6 is a detailed illustration 600 of the translucent lens/cover 630 in normal position. FIG. 7 is a reference view 700 showing all LEDs 760-766 lit.

Accordingly, FIGS. 5-7 illustrate a reduction is size that is achieved using a circular control panel. The rotational advantages and details inherent in the circular configuration according to embodiments of the present invention require a smaller area. In fact, a circular control panel according to an embodiment of the present invention provides a 21% reduction in area over a square control panel having a width equal to the diameter of the circular control panel. An even greater savings is achieved when a circular control panel according to an embodiment of the present invention is used rather than a rectangular control panel.

Figure 8:
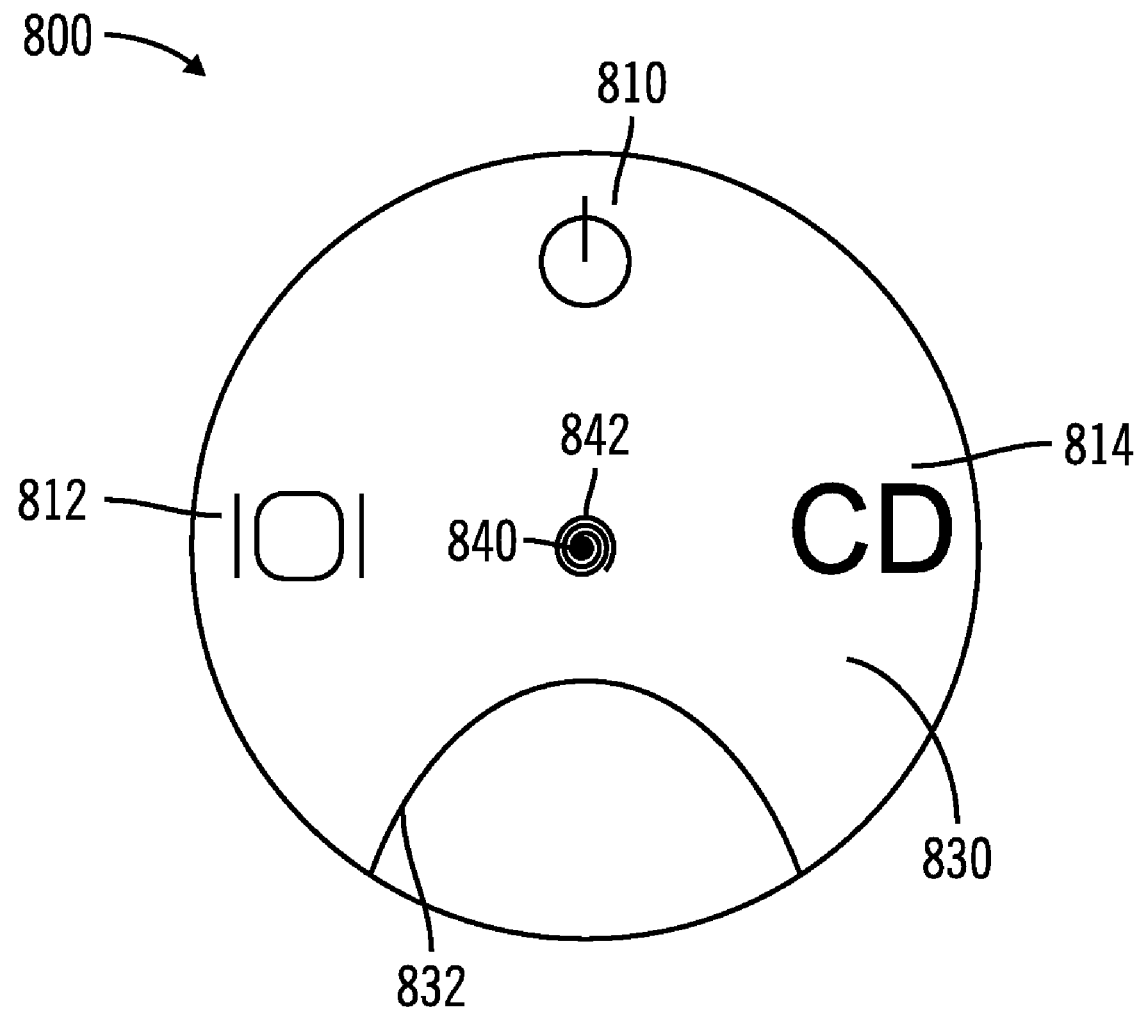
FIG. 8 shows a control panel that reduces overall size while providing integrated button protection for functional advantage according to another embodiment of the present invention.

FIG. 8 shows a control panel 800 that reduces overall size while providing integrated button protection for functional advantage according to another embodiment of the present invention. In FIG. 8, the lens/cover 830 includes only a single cutout 832 located on the bottom. The single cutout lens/cover design of FIG. 8 provides protection to all buttons 810, 812, 814 in the normal position because the cutout 832 is not aligned with any button when the lens 830 is in the normal position.

Figure 9:
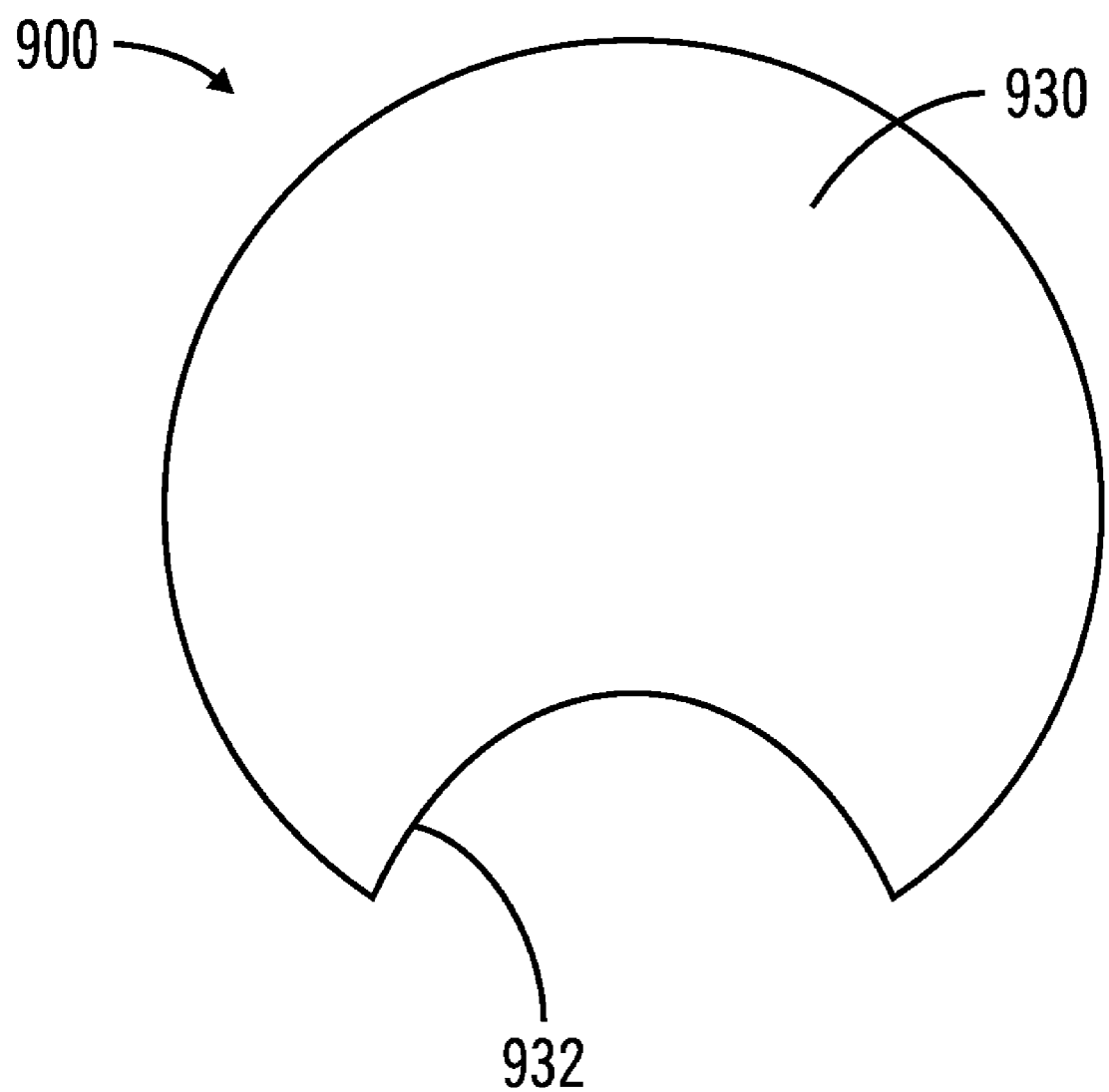
FIG. 9 is a detailed illustration of the translucent lens/cover in normal position.
Figure 10:
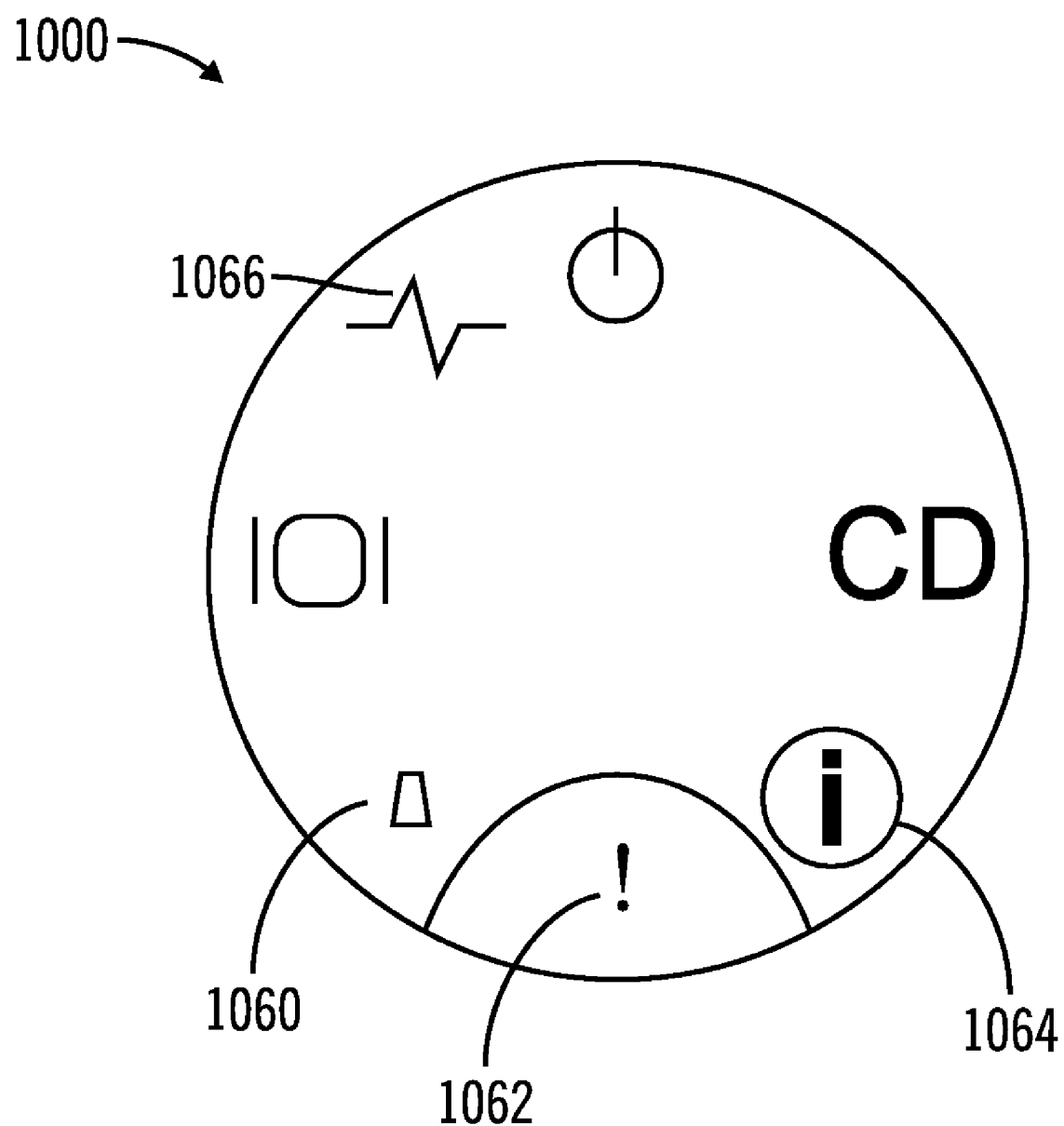
FIG. 10 is a reference view showing all LEDs lit.

Again, the lens rotates on a center pivot 840, 180 degrees, allowing any chosen button to be depressed while protecting all the others. The lens 830 may have a spring return 842 to bring the lens 830 back to normal bottom position when released. Also, in normal position, the cutout 832 of the lens 830 is over the most important LED (fault) 1062, see FIG. 10. This LED 1062 can thus show greater brightness because it is not hidden behind a translucent panel 830 as the fault LED is currently positioned in the control panel door or prior control panels. FIG. 9 is a detailed illustration 900 of the translucent lens/cover 930 in normal position with the cutout 932 positioned at bottom. FIG. 10 is a reference view 1000 showing all LEDs 1060-1062 lit.

Figure 11:
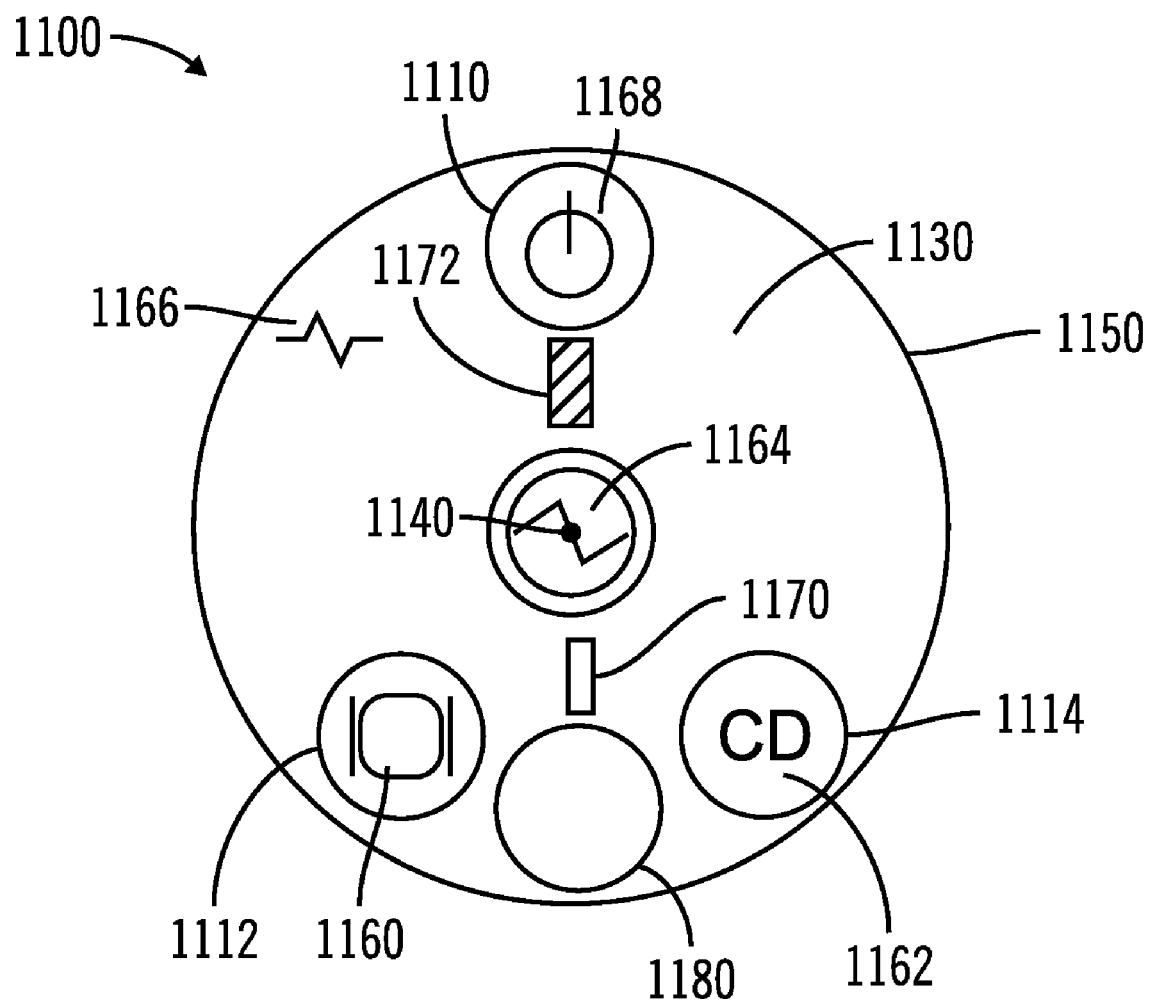
FIG. 11 shows a control panel that reduces overall size while providing integrated button protection for functional advantage according to yet another embodiment of the present invention.

FIG. 11 shows a control panel 1100 for a device that reduces overall size while providing integrated button protection for functional advantage according to yet another embodiment of the present invention. In FIG. 11, the control panel 1100 includes the three buttons 1110, 1112, 1114 and five LEDs 1160-1168 that may be needed for use on a blade. Again, those skilled in the art, however, will recognize that the present invention is not meant to be limited to the quantity of buttons and LEDs shown here. The control panel 1100 may be configured with various quantities of LEDs and buttons.

In FIG. 11, the control panel 1100 includes a clear (or translucent) lens 1130. When the lens 1130 is in a normal position, the lens 1130 is configured to protect all buttons from accidental activation. The lens 1130 is allowed to rotate about a center pivot 1140 to access buttons one at a time. The lens 1130 includes a selection aperture. Once the selection aperture 1180 is aligned with a button icon, the entire lens 1130 can be pressed to activate a button beneath the lens 1130. The lens 1130 thus serves as essentially one large button that may be pressed with a finger, the palm of a hand, or a mouth stick. In this way, multiple buttons can be tightly spaced in a small panel, but only one button can be activated at a time.

The lens/cover 1130 is rotated either by grasping the circumference 1150 of the lens 1130, or by placing one finger (or a mouth stick) in a dimple, raised ridge or other physical feature (not shown) that allows angular manipulation of the lens 1130. The lens 1130 of FIG. 11 allows for the construction of a very small control panel, and is not limited by finger size dictating minimum spacing between buttons. The lens 1130 can have visual marks or pointers that are intended to be aligned over the button of choice. The lens 1130 may also have tactile detents and/or audible clicks when aligned with any single button icon.

Figure 12:
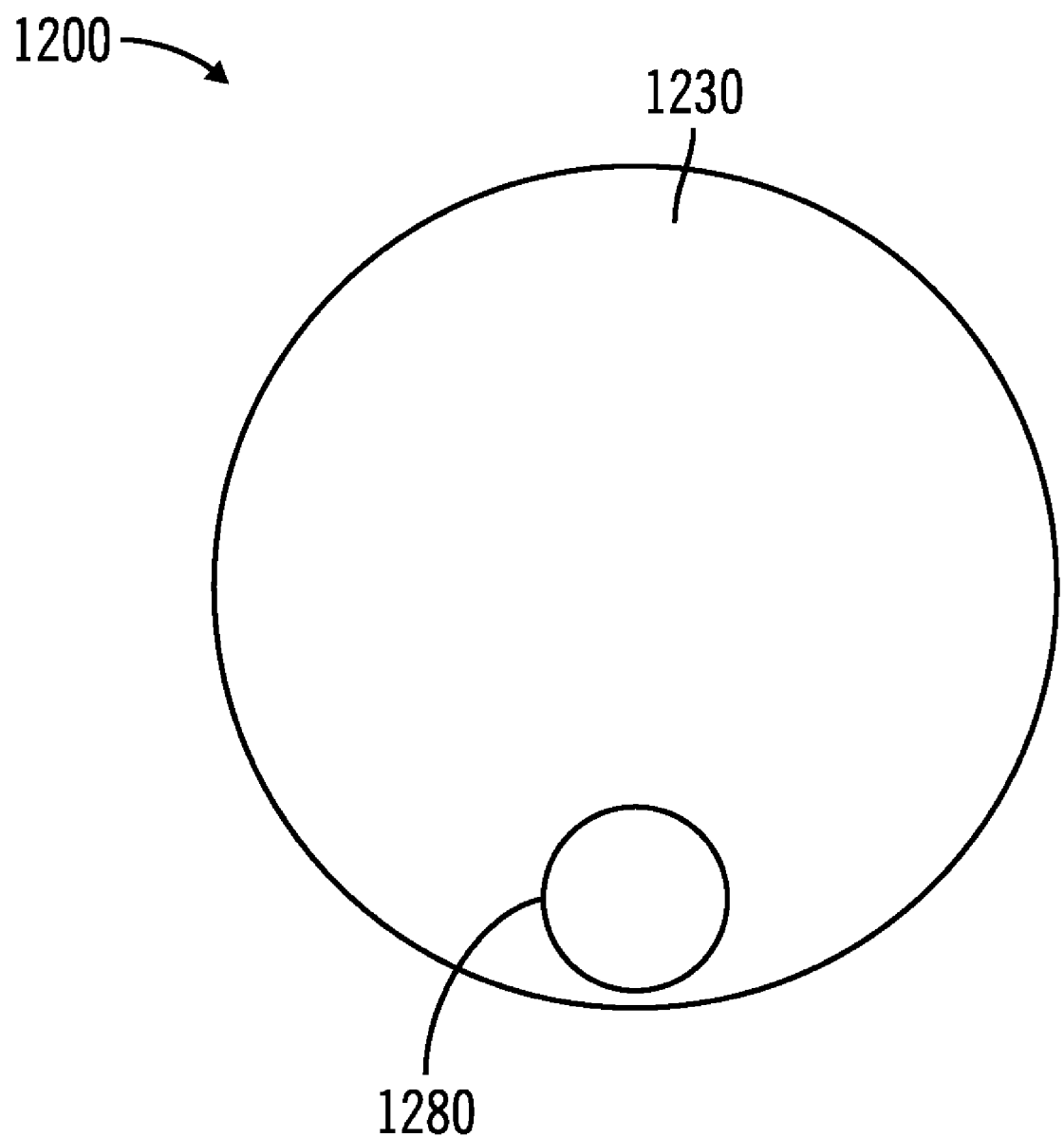
FIG. 12 is a detailed illustration of the translucent lens/cover in normal position.
Figure 13:
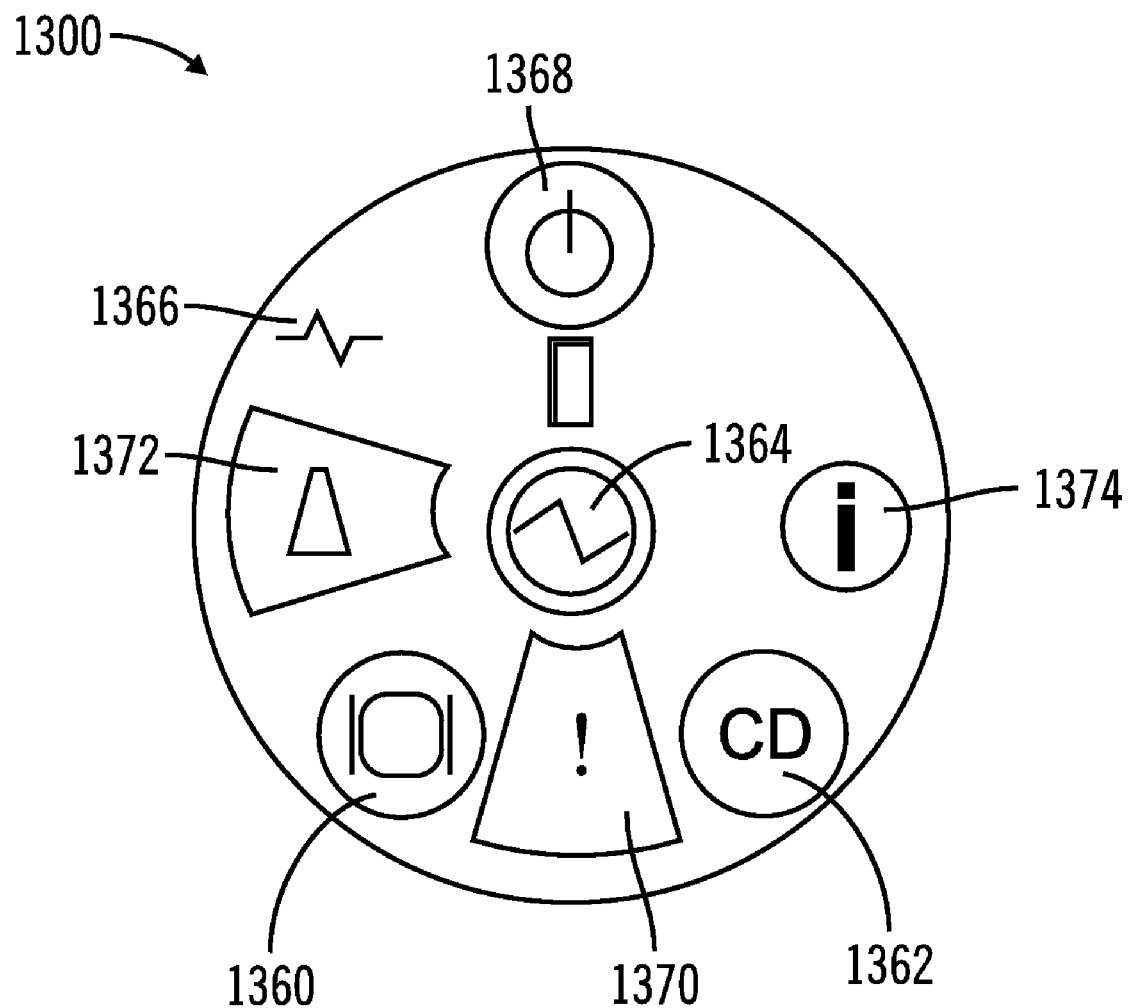
FIG. 13 is a reference view showing all LEDs lit.

While in FIG. 11 three buttons 1110, 1112, 1114 for switches are shown, more than three switches could be used. The readability of the icons can be enhanced by molding the lens in a magnifying shape to help read icons from a distance, or to extend the viewing angle of the icons/LEDs. The lens may also be configured with an interlock boss 1170 that is configured to require the lens/cover 1130 to be rotated so that selection aperture 1180 is positioned over the power button 1110 before the interlock boss 1170 engages interlock recess 1172 to allow latches to be opened to extract the device. Accordingly, the interlock boss 1170 and interlock recess 1172 operated to provide an interlock function to prevent the device from being removed until the selection aperture 1180 is aligned with the power button 1110 thereby acting as a reminder to power-off the device prior to removal. Those skilled in the art will recognize that the function of the boss 1170 and the recess 1172 may be reversed. Further, those skilled in the art will recognize that the interlock 1170/1172 may be implemented mechanically, electrically or by any other suitable means. FIG. 12 is a detailed illustration 1200 of the lens/cover 1230 in normal position with the selection aperture 1180 at the bottom. FIG. 13 is a reference view 1300 showing all LEDs 1360-1372 lit. FIG. 13 shows the interlock recess 1372 in the panel.

Figure 14:
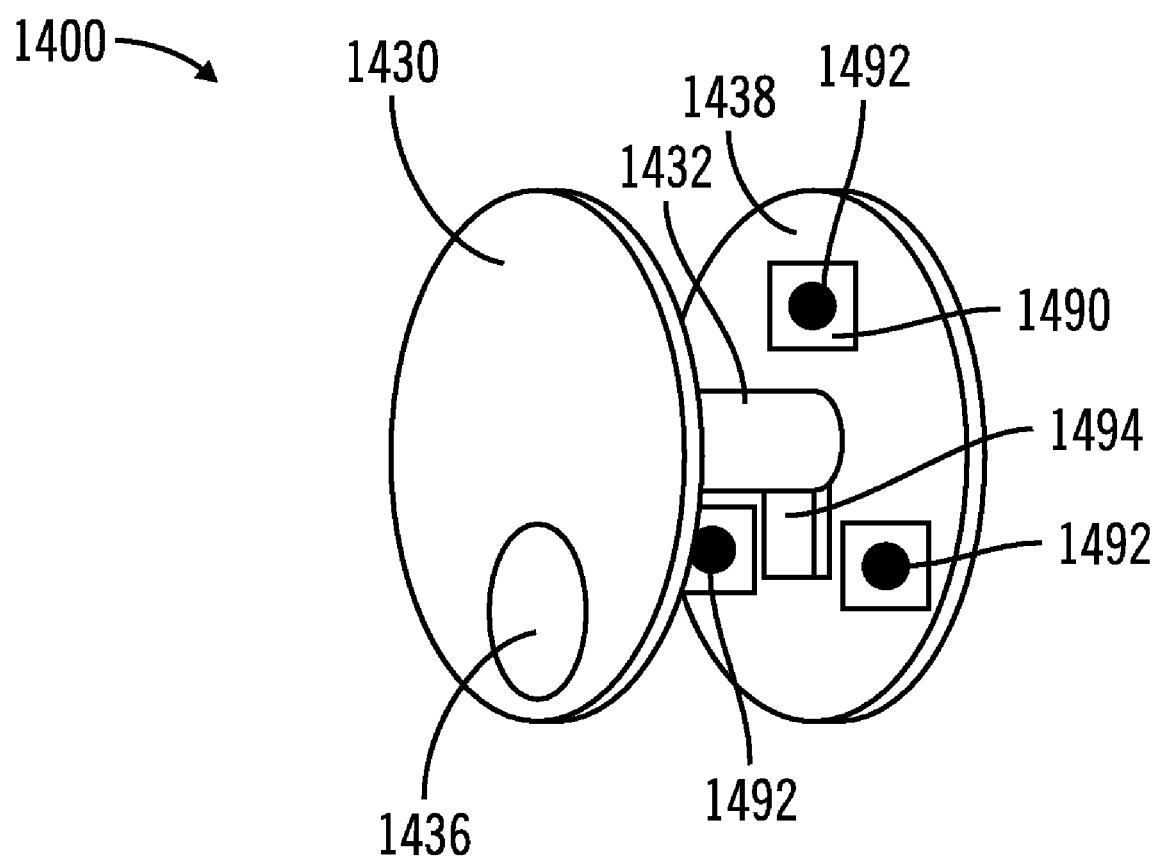
FIG. 14 illustrates the details of the control panel according to this embodiment of the present invention.

FIG. 14 illustrates the details of the control panel 1400 according to this embodiment of the present invention. The lens 1430 includes a selection aperture 1436 and may be attached to a central post 1432 projecting toward the panel face 1438. In this configuration, the bottom of the post 1432 may include a tab 1494 on its end that rotates with the lens 1430. Behind the panel face 1438 is a circuit board 1490. The circuit board 1490 includes switches 1492 that may be depressed when the lens 1430 is positioned so that the tab 1494 is positioned over one of the switches 1492.

Figure 15:
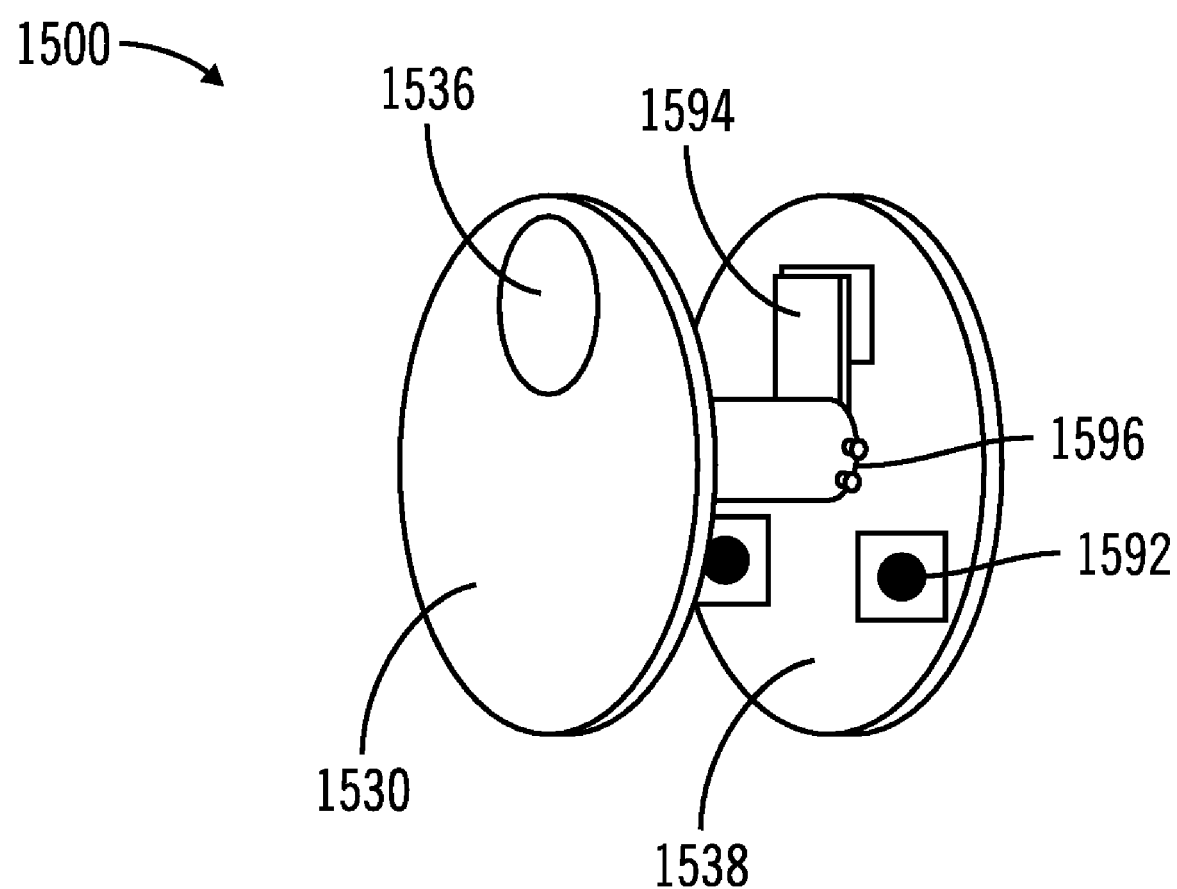
FIG. 15 shows the tab being aligned over a switch and the lens being pressed.

FIG. 15 is a view of the control panel 1500 showing the tab 1594 being aligned over a switch 1592 so that the lens 1530 may be pressed to engage the switch 1592. Also shown in FIG. 15 is an alignment structure 1596 that is configured to allow the lens 1530 to be rotated relative to the panel face by application of force to the lens 1530. The alignment structure 1596 may comprise any type of precise alignment arrangement. For example, the alignment structure 1596 may comprise a catch, a serration, a ratchet, a spring-operated ball, a resilient biased detenting plunger to interact with the detenting slots, etc. to provide precise alignment of the selection aperture of the lens 1530 with a function activator, e.g., switch 1592, associated with the desired function. The alignment structure 1596 may also convey tactile feedback to the user when positioning the selection aperture 1536 relative the panel face 1538.

Figure 16:
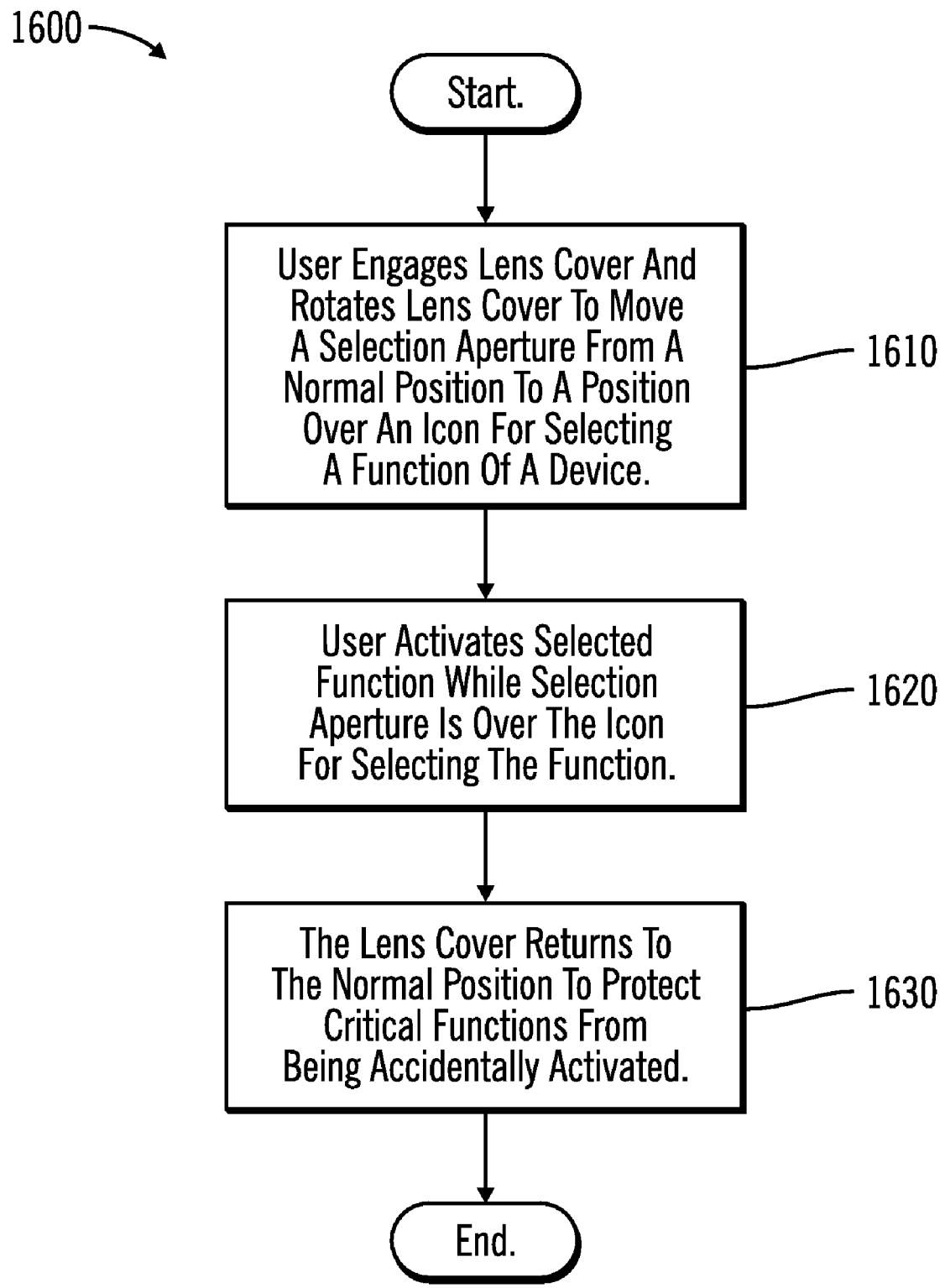
FIG. 16 is a flow chart of a method for using a control panel that reduces overall size while providing integrated button protection for functional advantage according to an embodiment of the present invention.

FIG. 16 is a flow chart 1600 of a method for using a control panel that reduces overall size while providing integrated button protection for functional advantage according to an embodiment of the present invention. User engages a lens cover and rotate the lens cover to move a selection aperture from a normal position to a position over an icon for selecting a function of a device 1610. User activates selected function while selection aperture is over the icon for selecting the function 1620. The lens cover returns to the normal position to protect critical functions from being accidentally activated 1630.

The foregoing description of the embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for providing control to a device, comprising:
   rotating a cover to move a selection aperture from a normal position to a position over an icon on a panel face for selecting a desired function of a device;
   allowing engagement of a function activator represented by the icon only when the selection aperture is moved to align with the icon including allowing simultaneous access to function activators associated with non-critical functions while preventing access to any function activators associated with critical function when the cover is aligned in a first position; and allowing access to only one function activator associated with a critical function at a time when aligned in a second position; and
   activating the desired function while the selection aperture is over the icon for selecting the function.

2. The method of claim 1 further comprising preventing engagement of two of said function activators at the same time.

3. The method of claim 1 further comprising returning the cover when released to a normal position to protect critical functions from being accidentally activated.

4. The method of claim 1 further comprising covering all function activators to prevent accidental engagement when the cover is in the normal position.

* * * * *